(12) United States Patent
Teo

(10) Patent No.: US 7,015,756 B1
(45) Date of Patent: Mar. 21, 2006

(54) PUSH-PULL BUFFER/AMPLIFIER

(75) Inventor: Swee-Ann Teo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/189,464

(22) Filed: Jul. 26, 2005

Related U.S. Application Data

(63) Continuation of application No. 10/744,184, filed on Dec. 23, 2003, now Pat. No. 6,958,650.

(60) Provisional application No. 60/470,603, filed on May 14, 2003.

(51) Int. Cl.
*H03F 3/45* (2006.01)
*H03F 3/26* (2006.01)

(52) U.S. Cl. .................. 330/255; 330/262

(58) Field of Classification Search .......... 330/255, 330/262
See application file for complete search history.

(56) References Cited

U.S. PATENT DOCUMENTS

| | | | |
|---|---|---|---|
| 5,581,212 A | 12/1996 | Huang et al. | 330/253 |
| 5,764,105 A | 6/1998 | Botker | 330/252 |
| 5,825,244 A | 10/1998 | Somayajula | 330/253 |
| 5,844,443 A | 12/1998 | Wong | 330/275 |
| 6,380,808 B1 | 4/2002 | Uasa et al. | 330/263 |
| 6,927,629 B1 * | 8/2005 | Tomita | 330/252 |
| 6,958,650 B1 * | 10/2005 | Teo | 330/252 |
| 2002/0057132 A1 | 5/2002 | Tomita | 330/252 |

FOREIGN PATENT DOCUMENTS

WO  WO 01/41300 A1  6/2001

\* cited by examiner

*Primary Examiner*—Steven J. Mottola

(57) ABSTRACT

A differential circuit comprises first, second, third and fourth devices that have first, second, third and fourth control terminals, respectively. The second and fourth devices are arranged in series with the first and third devices, respectively. A first output communicates with the first device and the second device. A second output communicates with the third device and the fourth device. First and second inputs communicate with the first and fourth control terminals, respectively. The first, second, third and fourth devices are the same type of devices. The third and second control terminals follow the first and fourth control terminals. When the first device pushes, the third device pulls. When the first device pulls, the third device pushes. When the fourth device pushes, the second device pulls. When the fourth device pulls, the second device pushes. The second and third devices and the first and fourth devices are matched.

10 Claims, 8 Drawing Sheets

PUSH-PULL BUFFER/AMPLIFIER

CROSS-REFERENCE TO RELATED APPLICATION

This application is a continuation of U.S. patent application Ser. No. 10/744,184 filed Dec. 23, 2003, now U.S. Pat. No. 6,958,650 which claims the benefit of U.S. Provisional Application No. 60/470,603 filed May 14, 2003, which are both hereby incorporated herein by reference in their entirety.

FIELD OF THE INVENTION

The present invention relates to buffer and amplifier circuits, and more particularly to buffer and amplifier circuits that drive low impedance capacitive loads at high frequencies.

BACKGROUND OF THE INVENTION

Buffer and amplifier circuits include emitter follower circuits of the type illustrated in FIG. 1. The emitter follower is typically characterized by a high input impedance and a low output impedance. Therefore, it is useful as an isolation or buffer amplifier (e.g., a unity gain buffer) for connecting a high impedance source to a low impedance load.

With further reference to FIG. 1, when control terminal $V_+$ is pulled sufficiently high, transistor $Q_1$ is biased on to provide a corresponding voltage at positive output terminal $V_{out+}$. When control terminal $V_+$ is pulled low, transistor $Q_1$ is biased off and transistor $Q_3$ draws current from a load (not shown) via the positive output terminal $V_{out+}$. Similarly, when control terminal $V_-$ is pulled high, transistor $Q_2$ is biased on to provide a corresponding voltage at negative output terminal $V_{out-}$. When control terminal $V_-$ is pulled low, transistor $Q_2$ is biased off and transistor $Q_4$ draws a current from the load via the negative output terminal $V_{out-}$.

One disadvantage of the circuit shown in FIG. 1 is that it consumes excessive power. Specifically, transistors $Q_3$ and $Q_4$ are biased on by the current source 102 and transistor $Q_5$. Therefore, when the control terminal $V_+$ is pulled high, transistor $Q_1$ provides the current drawn by transistor $Q_3$ in addition to providing current to the load via positive output terminal $V_{out+}$. Likewise, when the control terminal $V_-$ is pulled high, transistor $Q_2$ provides the current drawn by transistor $Q_4$ in addition to providing current to the load via the negative output terminal $V_{out-}$. Thus, the current drawn by transistors $Q_3$ and $Q_4$ when transistors $Q_1$ and $Q_2$, respectively, are on is wasted.

For high frequency applications involving capacitive (including partly capacitive) loads, the overall impedance of the capacitive load is typically low. Therefore, the transconductance of the transistors must be increased in order to drive the low impedance. Additionally, the bias current of the circuit shown in FIG. 1 must be sufficiently large such that the output stage is not slew limited. As frequency is increased, emitter followers of the type shown in FIG. 1 require additional current in order to drive low impedance loads.

FIG. 2 illustrates a known common-emitter differential amplifier. When control terminal $V_+$ is pulled low, transistor $Q_6$ is biased off such that current is provided from voltage supply $V_{cc}$ and through a resistor $R_1$ to a load via negative output terminal $V_{out-}$. Conversely, when control terminal $V_-$ is pulled low, transistor $Q_7$ is biased off such that current is provided from the voltage supply $V_{cc}$ and through a resistor $R_2$ to the load via positive output terminal $V_{out+}$.

In the case of capacitive loads, voltage supply $V_{cc}$ is essentially coupled to an RC circuit. The load represents the capacitance C of the RC circuit. Thus, as the value R of resistors $R_1$ and $R_2$ is increased, the bandwidth of the differential amplifier decreases. Specifically, the bandwidth of the amplifier is given by:

$$f_{BW} = \frac{1}{2\pi RC}$$

For high frequency applications, it is often desirable to have $f_{BW} \gg f_{opt}$, where $f_{opt}$ is the operating frequency. If R is too small, however, excessive current will be conducted through transistors $Q_6$ and $Q_7$. This is because the amplitude of the output is given by $i_{bias}R$. Assuming transistors $Q_6$ and $Q_7$ are fully switched such that the current is steered to any one side during operation, a relatively large current is required to have sufficient amplitude during high frequency operation.

Referring now to FIG. 3, a class B push-pull amplifier is shown. When control terminal $V_{in}$ is pulled high, transistor $Q_8$ is biased on and transistor $Q_9$ is biased off, resulting in transistor $Q_8$ "pushing" current to a load via output terminal $V_{out}$. Conversely, when control terminal $V_{in}$ is pulled low, transistor $Q_8$ is biased off and transistor $Q_9$ is biased on, resulting in transistor $Q_9$ "pulling" current from the load via the output terminal $V_{out}$.

The buffer of FIG. 3 is generally efficient in terms of current consumption as compared to the buffer/amplifiers of FIGS. 1 and 2. However, transistor $Q_9$ is typically a PNP bipolar junction transistor or a p-type MOS transistor. Because PNP bipolar junction transistors and p-type MOS transistors have less transconductance than their n-type counterparts, the buffer of FIG. 3 may either significantly load a previous stage to which the buffer is coupled, or the p-type transistor $Q_9$ may be so weak that output waveforms are distorted. Further, p-type devices typically have low $g_m$ values and therefore are generally not well suited for high frequency applications.

SUMMARY OF THE INVENTION

A differential circuit comprises first, second, third and fourth devices that have first, second, third and fourth control terminals, respectively. The second and fourth devices are arranged in series with the first and third devices, respectively. A first output communicates with the first and second devices. A second output communicates with the third and fourth devices. First and second inputs communicate with the first and fourth control terminals, respectively. The first, second, third and fourth devices are the same type of devices. The second and third control terminals follow the first and fourth control terminals, respectively. When the first device pushes, the third device pulls. When the first device pulls, the third device pushes. When the fourth device pushes, the second device pulls. When the fourth device pulls, the second device pushes. The second and third devices and the first and fourth devices are matched.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF PREFERRED EMBODIMENTS

Figure 1:
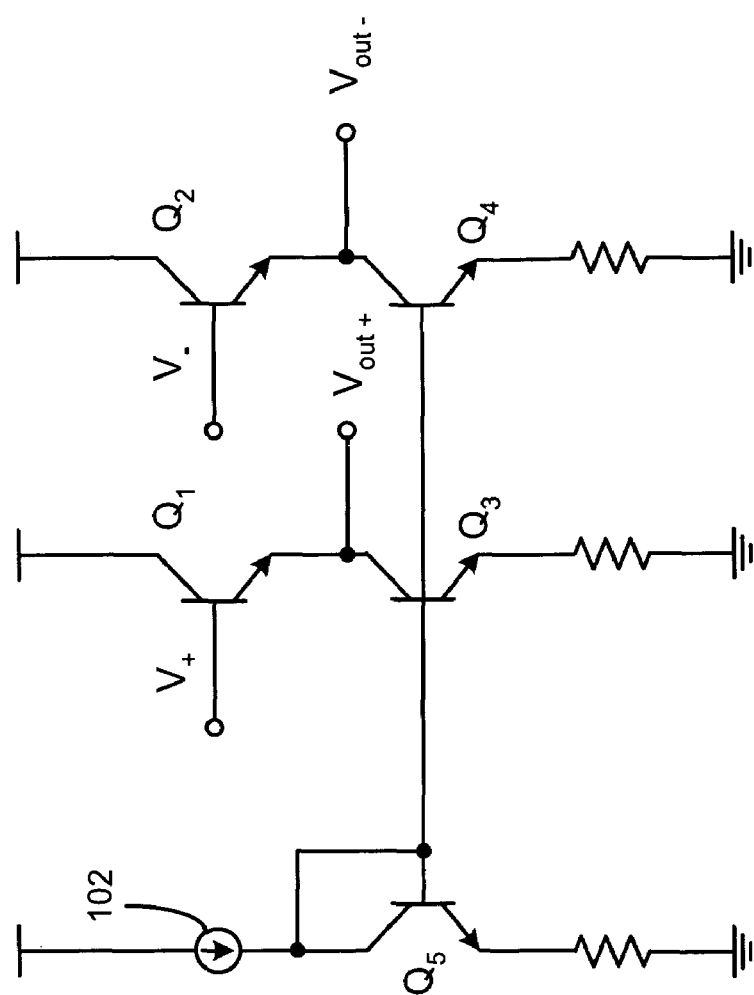
FIG. 1 is an electrical schematic of a prior art emitter follower circuit.
Figure 2:
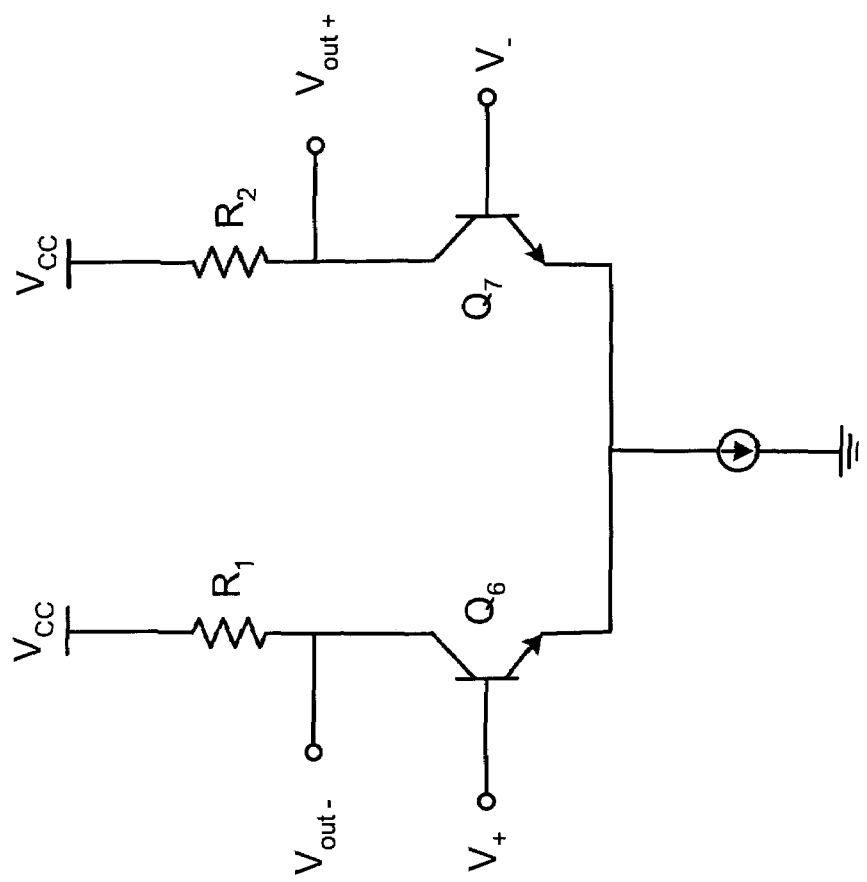
FIG. 2 is an electrical schematic of a prior art common-emitter differential amplifier circuit.
Figure 3:
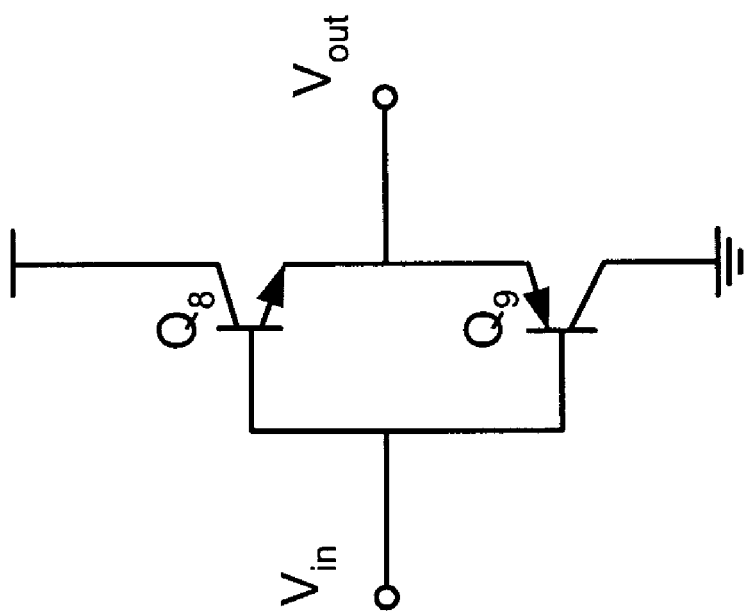
FIG. 3 is an electrical schematic of a prior art class B output stage that operates in a push-pull fashion.

The following description of preferred embodiments is merely exemplary in nature and is in no way intended to limit the invention, its application, or uses. The same reference numerals are used to indicate similar elements or features throughout the drawings.

Figure 4:
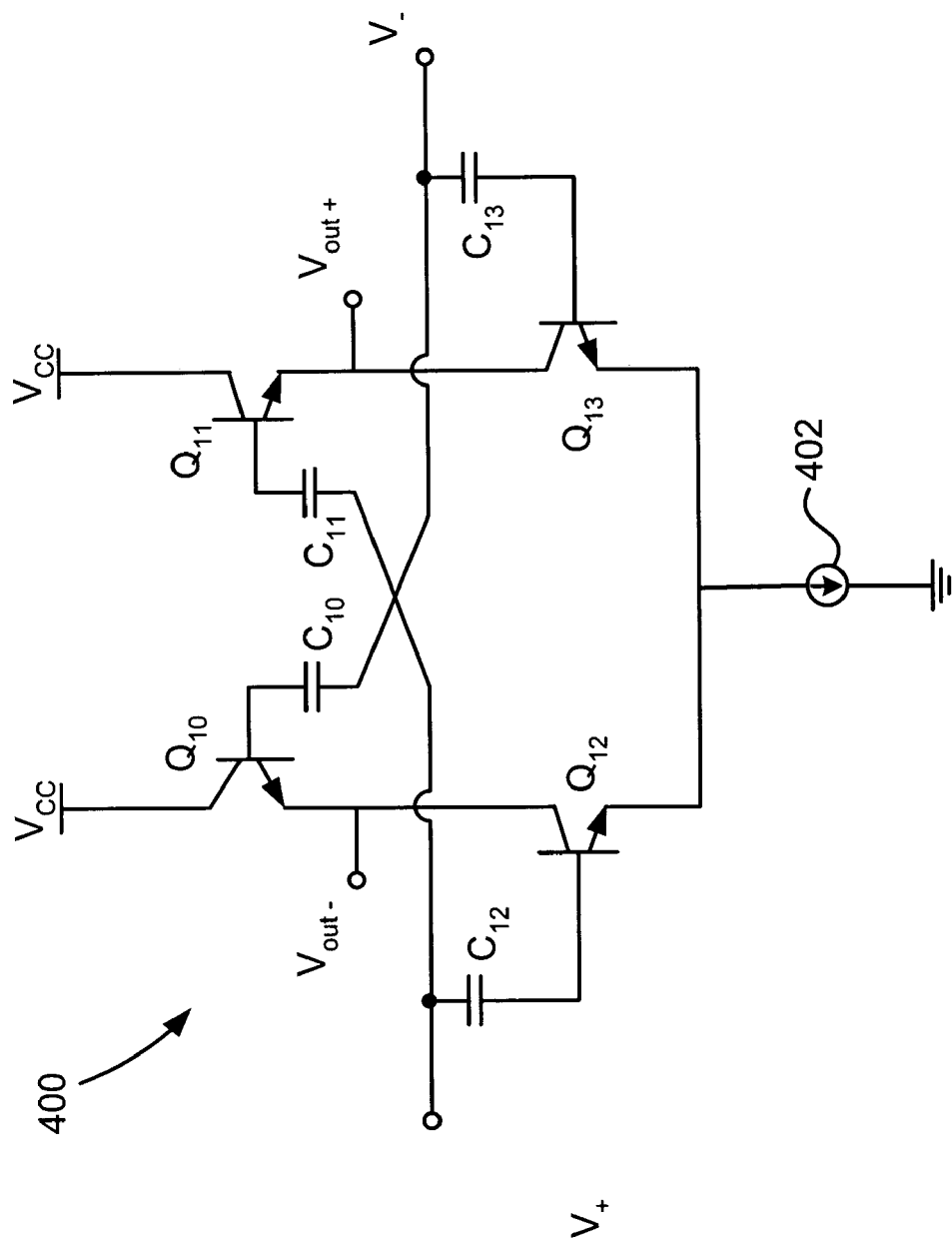
FIG. 4 is an electrical schematic of a buffer/amplifier circuit according to one embodiment of the present invention.

A buffer circuit according to one preferred embodiment of the present invention is illustrated in FIG. 4 and indicated generally by reference numeral 400. As shown in FIG. 4, the buffer circuit 400 includes four bipolar junction transistors $Q_{10}$, $Q_{11}$, $Q_{12}$, and $Q_{13}$. A positive input terminal $V_+$ is coupled to the base of transistor $Q_{11}$ as well as to the base of transistor $Q_{12}$. A negative input terminal $V_-$ is coupled to the base of transistor $Q_{10}$ as well as to the base of transistor $Q_{13}$. A positive output terminal $V_{out+}$ is coupled to the emitter of transistor $Q_{11}$ and to the collector of transistor $Q_{13}$. A negative output terminal $V_{out-}$ is coupled to the emitter of transistor $Q_{10}$ and to the collector of transistor $Q_{12}$. The collectors of transistors $Q_{10}$, $Q_{11}$ are coupled to supply voltage terminals $V_{cc}$, and the emitters of transistors $Q_{12}$, $Q_{13}$ are both coupled to one side of a bias current source 402. The other side of the current source 402 is coupled to ground.

As shown in FIG. 4, the positive input terminal $V_+$ is preferably coupled to the bases of transistors $Q_{11}$, $Q_{12}$ through speed-up capacitors $C_{11}$, $C_{12}$, respectively. Similarly, the negative input terminal $V_-$ is preferably coupled to the bases of transistors $Q_{10}$, $Q_{13}$ through speed-up capacitors $C_{10}$, $C_{13}$, respectively.

In operation, transistors $Q_{10}$ and $Q_{11}$ essentially act as emitter followers, while transistors $Q_{12}$ and $Q_{13}$ function as a switch pair transconductance. The combined action of these two sets of transistors enhances the buffering action that each provides.

Assuming, for example, a sinusoidal input signal is applied across the positive and negative input terminals $V_+$, $V_-$ and a load is connected across the positive and negative output terminals $V_{out+}$, $V_{out-}$, the circuit 400 of FIG. 4 generally operates as follows. When the positive input terminal $V_+$ is pulled high, transistors $Q_{11}$ and $Q_{12}$ are biased on, while transistors $Q_{10}$ and $Q_{13}$ are biased off. Therefore, transistor $Q_{11}$ pushes current to the load via the positive output terminal $V_{out+}$ while, at the same time, transistor $Q_{12}$ pulls current from the load via negative output terminal $V_{out-}$. Conversely, when the negative input terminal $V_-$ is pulled high, transistors $Q_{10}$ and $Q_{13}$ are biased on, while transistors $Q_{11}$ and $Q_{12}$ are biased off. Therefore, transistor $Q_{10}$ pushes current to the load via the negative output terminal $V_{out-}$ while, at the same time, transistor $Q_{13}$ pulls current from the load via the positive output terminal $V_{out+}$. Thus, the circuit of FIG. 4 simultaneously pushes current to one side of a load while pulling current from the other side of the load. In this manner, the load can be readily charged (or discharged), including when the load is capacitive and/or driven at high frequency.

By switching off transistor $Q_{13}$ while transistor $Q_{11}$ pushes current to the load via the positive output terminal $V_{out+}$, transistor $Q_{11}$ is isolated from a path of the bias current, which generally flows at such time from the negative output terminal $V_{out-}$ to ground through the transistor $Q_{12}$ and the bias current source 402. Similarly, by switching off transistor $Q_{12}$ while transistor $Q_{10}$ pushes current to the load via the negative output terminal $V_{out-}$, transistor $Q_{10}$ is isolated from the path of the bias current, which generally flows at such time from the positive output terminal $V_{out+}$ to ground through the transistor $Q_{13}$ and the bias current source 402. Thus, unlike many prior art buffers, the transistor supplying current to one of the output terminals at a given time is not also required to supply the bias current. Accordingly, less current consumed.

Figure 5:
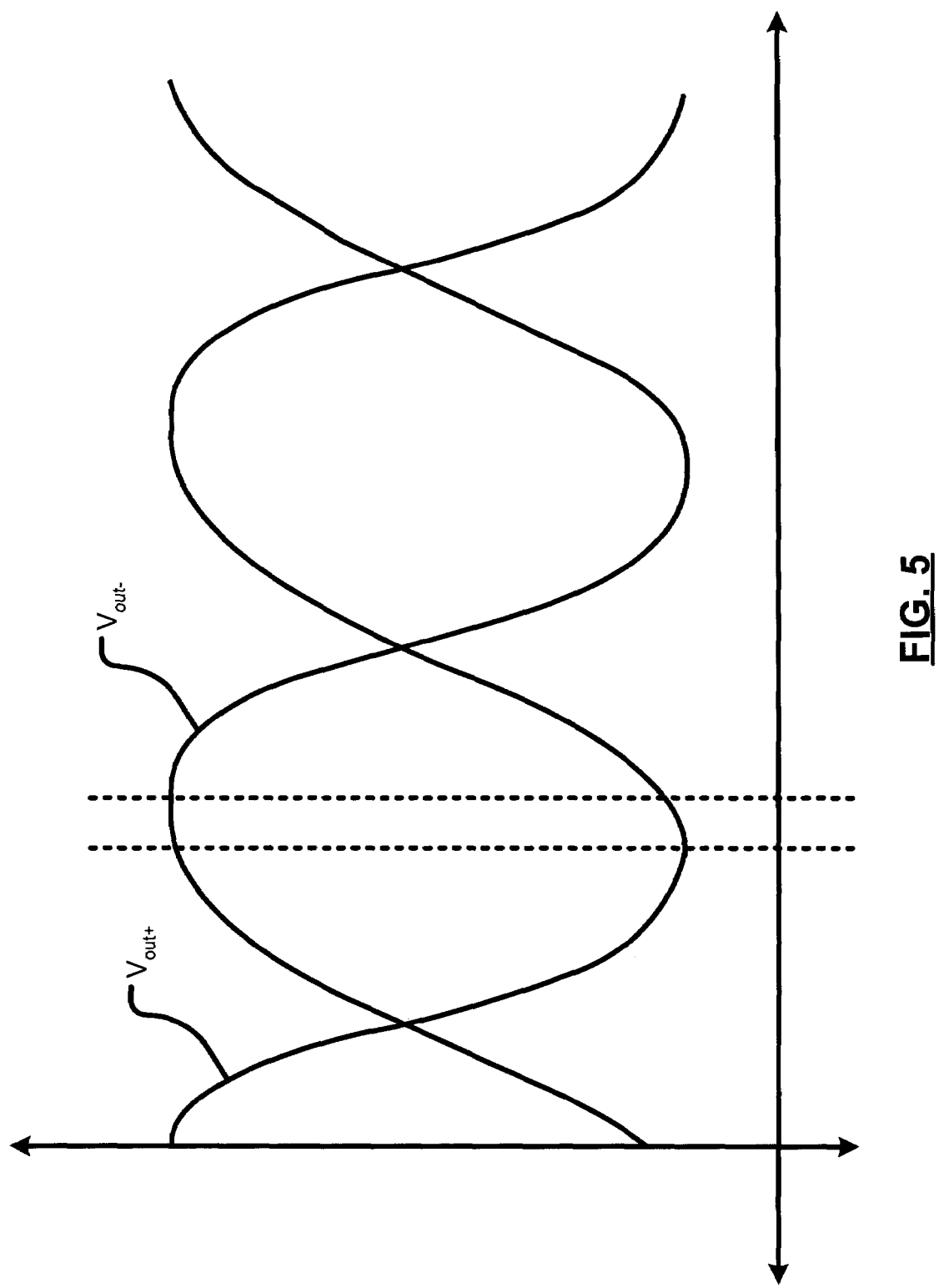
FIG. 5 is a waveform diagram illustrating a time lag between the output signals of the circuit of FIG. 4 when driving a capacitive load.

It should also be noted that, during operation of the circuit of FIG. 4, there is a small period of time when transistors $Q_{11}$ and $Q_{13}$ are both conducting (and essentially interfering with one another), and a small period of time when transistors $Q_{10}$ and $Q_{12}$ are both conducting (and essentially interfering with one another). This is because the lower transistors $Q_{12}$ and $Q_{13}$ are generally biased on as their input signals climb above the reference voltage (i.e., the zero crossing), whereas the upper transistors $Q_{10}$ and $Q_{11}$ are generally biased on as their input signals rise above their peak negative values (i.e., before the zero crossing). As a result, the voltages at the positive and negative output terminals $V_{out+}$, $V_{out-}$ are not exactly 180 degrees out of phase, as shown in FIG. 5. In other words, a positive voltage peak at one of the output terminals does not fully coincide with, but rather slightly lags in time, a negative voltage peak at the other output terminal. The positions of the peaks are a function of the capacitive load. This effect does not occur when the circuit is resistively loaded instead of capacitively loaded.

Figure 6:
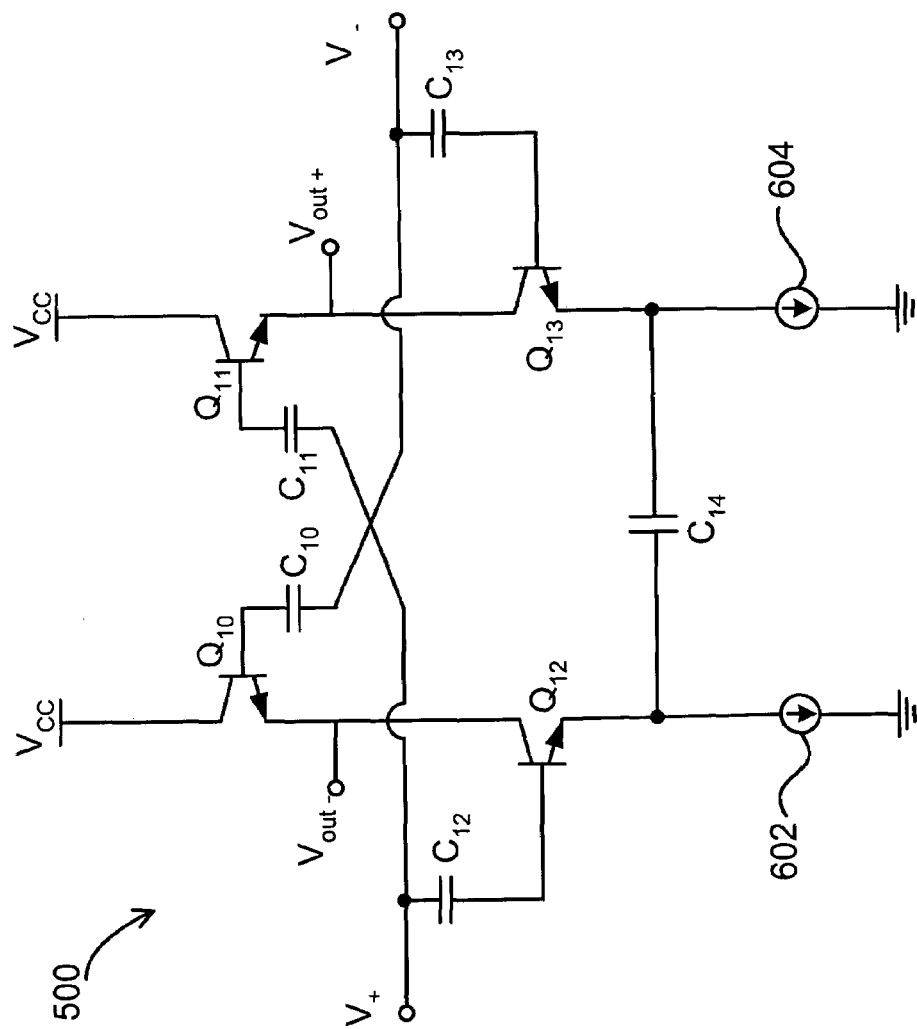
FIG. 6 is an electrical schematic of a buffer/amplifier circuit according to another embodiment of the present invention employing a degeneration capacitor.
Figure 7:
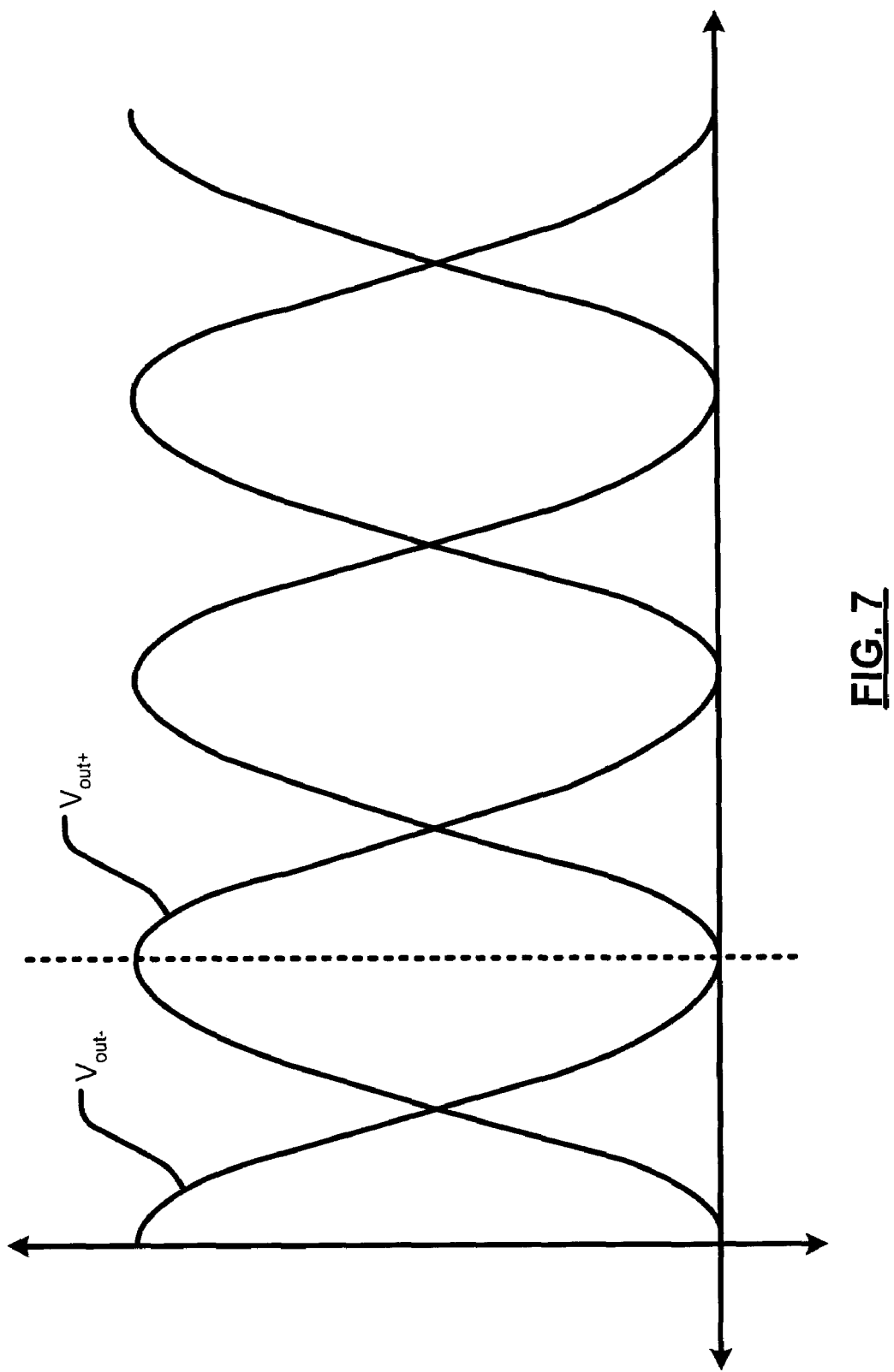
FIG. 7 is a waveform diagram illustrating the effect of a degeneration capacitor on the output signals of the circuit of FIG. 6 when driving a capacitive load.

To compensate for the output phase difference illustrated in FIG. 5, a degeneration capacitor $C_{14}$ can be coupled between the emitters of transistors $Q_{12}$ and $Q_{13}$, as shown in FIG. 6. Additionally, in the embodiment of FIG. 6, two bias current sources 602, 604 are provided in place of the single current source 402 of FIG. 4. As shown in FIG. 6, one of the current sources 602 is coupled to the emitter of transistor $Q_{12}$, and the other current source 604 is coupled to the emitter of transistor $Q_{13}$. By including the degeneration capacitor $C_{14}$ in the circuit 600 of FIG. 6, transistors $Q_{12}$ and $Q_{13}$ are capacitively degenerated to produce sufficient phase shift such that transistors $Q_{11}$ and $Q_{13}$ are not biased on at the same time, and transistors $Q_{10}$ and $Q_{12}$ are not biased on at the same time. As a result, the voltages at the output terminals $V_{out+}$, $V_{out-}$ are substantially 180 degrees out of phase, as illustrated in FIG. 7.

Figure 8:
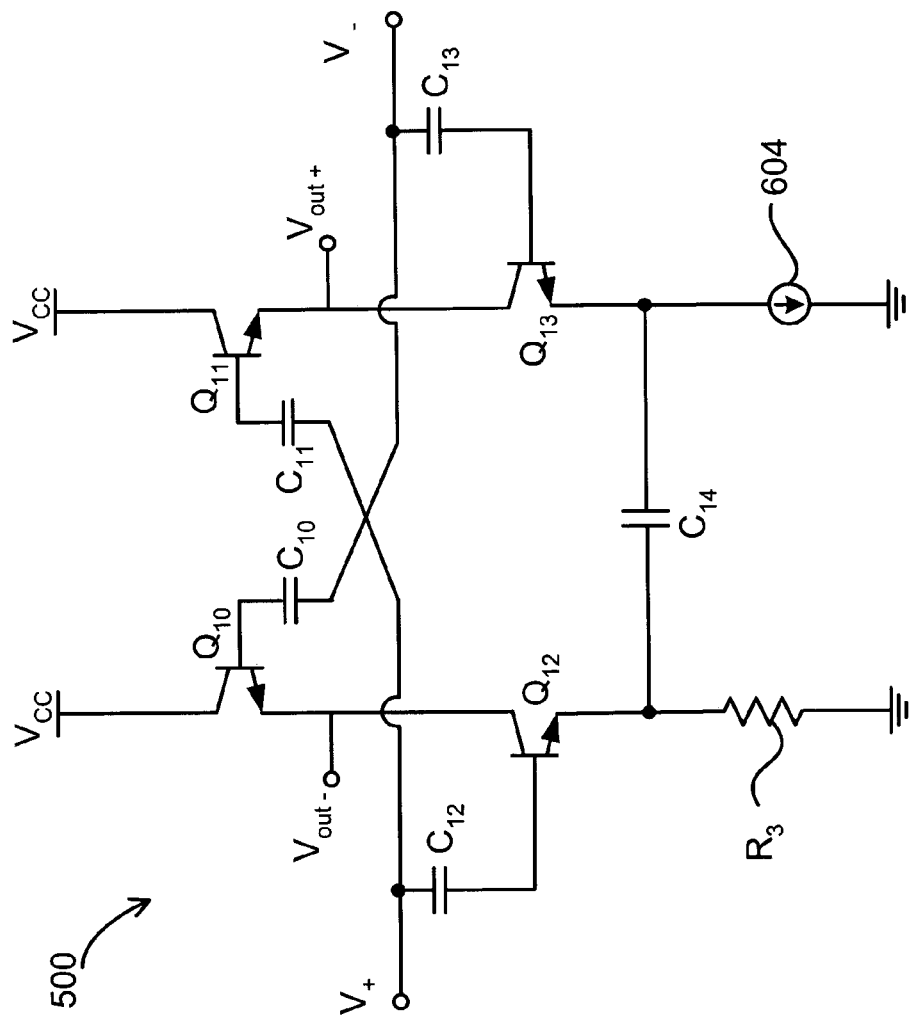
FIG. 8 is an electrical schematic of a buffer/amplifier circuit according to another embodiment of the present invention.

As an alternative to the circuit 600 of FIG. 6, which employs two current sources 602 and 604, the current source 602 can be replaced with a suitable resistor $R_3$, as shown in FIG. 8. If the values of resistor $R_3$ and capacitor $C_{14}$ are relatively large, the impedance of the capacitor $C_{14}$ will dominate at high frequency and the circuit 800 will function much like the circuit 600 of FIG. 6.

Those skilled in the art will appreciate that the buffer circuits of FIGS. 4, 6 and 8 can be readily configured as amplifiers, rather than unity gain buffers, if desired for any given application of the invention.

Preferably, transistors $Q_{10}$ and $Q_{11}$, as well as transistors $Q_{12}$ and $Q_{13}$, are matched transistor pairs having substantially the same operating characteristics. Even more preferably, all four transistors $Q_{10}$–$Q_{13}$ are matched and have the same performance characteristics.

For the specific embodiments shown in FIGS. 4, 6 and 8, transistors $Q_{10}$–$Q_{13}$ are NPN bipolar junction transistors (BJTs). It should be understood, however, that other types of transistors may be employed without departing the scope of the present invention.

One preferred application for the buffer/amplifier circuits of FIGS. 4, 6 and 8 is in video buffering, including buffering of video clock signals. The buffer/amplifier circuits may also be used to drive off-chip capacitive loads. Those skilled in the art will appreciate, however, that the teachings of the present invention are not so limited, and can be applied in a wide variety of applications.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A differential circuit comprising:
    first, second, third and fourth devices that have first, second, third and fourth control terminals, respectively wherein said second and fourth devices are arranged in series with said first and third devices, respectively;
    a first output that communicates with said first device and said second device;
    a second output that communicates with said third device and said fourth device;
    a first input that communicates with said first control terminal;
    a second input that communicates with said fourth control terminal,
    wherein said first, second, third and fourth devices are the same type of devices;
    wherein said third control terminal follows said first control terminal, and said second control terminal follows said fourth control terminal;
    wherein when said first device pushes, said third device pulls;
    wherein when said first device pulls, said third device pushes;
    wherein when said fourth device pushes, said second device pulls;
    wherein when said fourth device pulls, said second device pushes;
    wherein said second and third devices are matched; and
    wherein said first and fourth devices are matched.

2. The differential circuit of claim 1 wherein the first, second, third and fourth devices are matched.

3. The differential circuit of claim 1 wherein said first, second, third, and fourth devices comprise transistors.

4. The differential circuit of claim 1 further comprising first and second capacitances, wherein the first input communicates with the first and third control terminals through the first and second capacitances, respectively.

5. The differential circuit of claim 1 further comprising third and fourth capacitances, wherein the second input communicates with the second and fourth control terminals through the third and fourth capacitances, respectively.

6. The differential circuit of claim 1 further comprising a capacitance that communicates with the first and fourth devices.

7. The differential circuit of claim 6 further comprising:
    a first bias current source that communicates with the first device and one end of the capacitance; and
    a second bias current source that communicates with the fourth device and an opposite end of the capacitance.

8. The differential circuit of claim 1 further comprising at least one bias current source that communicates with the first and fourth devices.

9. The differential circuit of claim 3 wherein the transistors comprise bipolar junction transistors.

10. The differential circuit of claim 1 wherein the differential circuit implements one of a unity gain buffer and an amplifier.

* * * * *